(12) United States Patent
See et al.

(10) Patent No.: US 12,156,331 B2
(45) Date of Patent: Nov. 26, 2024

(54) TECHNOLOGIES FOR POWER TUNNELS ON CIRCUIT BOARDS

(71) Applicant: Intel Corporation, Santa Clara, CA (US)

(72) Inventors: Khai Ern See, Bayan Lepas (MY); Jia Lin Liew, Lunas (MY); Tin Poay Chuah, Penang (MY); Chee How Lim, Penang (MY); Yi How Ooi, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 735 days.

(21) Appl. No.: 17/212,016

(22) Filed: Mar. 25, 2021

(65) Prior Publication Data

US 2021/0212205 A1    Jul. 8, 2021

(51) Int. Cl.
*H05K 1/02* (2006.01)
*H01L 21/3105* (2006.01)
(Continued)

(52) U.S. Cl.
CPC .......... *H05K 1/115* (2013.01); *H05K 1/0298* (2013.01); *H05K 3/0047* (2013.01); *H05K 3/423* (2013.01); *H05K 2201/09563* (2013.01); *H05K 2201/10037* (2013.01); *H05K 2201/10128* (2013.01); *H05K 2203/107* (2013.01)

(58) Field of Classification Search
CPC ........ H05K 1/02; H05K 1/0298; H05K 1/115; H05K 3/0047; H05K 3/423; H01L 21/3105; H01L 21/28562; H01L 21/32051; H01L 21/76843; H01L 21/76844; H01L 21/76846; H01L 21/76855; H01L 21/76861; H01L 21/76873; H01L 21/76877; H01L 21/76886; H01L 23/523; H01L 23/5226; H01L 23/5329; H01L 23/53223; H01L 23/53238; H01L 23/53252; H01L 23/53258
USPC ........ 174/262; 438/584, 597, 622, 618, 627, 438/685, 640, 694, 650, 706; 257/532, 257/637, 751, 758
See application file for complete search history.

(56) References Cited

U.S. PATENT DOCUMENTS 5,930,669 A * 7/1999 Uzoh ................. H01L 23/5226
                                                    257/E21.585
6,211,071 B1 * 4/2001 Lukanc .............. H01L 21/2885
                                                    257/E21.255

(Continued)

OTHER PUBLICATIONS

Millennium Circuits Limited (MCL), "Copper Filling of Blind Microvias;" as accessed Jul. 15, 2021 at https://www.mclpcb.com/blog/copper-filling-blind-microvias/ (5 pgs.).

(Continued)

*Primary Examiner* — Xiaoliang Chen
(74) *Attorney, Agent, or Firm* — Alliance IP, LLC

(57) ABSTRACT

Techniques for power tunnels on circuit boards are disclosed. A power tunnel may be created in a circuit board by drilling through non-conductive layers to a conductive trace and then filling in the hole with a conductor. A power tunnel can have a high cross-sectional area and can carry a larger amount of current than an equivalent-width trace, reducing the area on a circuit board required to carry that amount of current.

9 Claims, 14 Drawing Sheets

(51) Int. Cl.
*H05K 1/11* (2006.01)
*H05K 3/00* (2006.01)
*H05K 3/42* (2006.01)

(56) References Cited

U.S. PATENT DOCUMENTS

| | | | | |
|---|---|---|---|---|
| 6,268,291 B1* | 7/2001 | Andricacos | ....... | H01L 21/76877 |
| | | | | 257/E21.585 |
| 6,335,570 B2* | 1/2002 | Mori | ................ | H01L 23/53238 |
| | | | | 257/762 |
| 6,440,861 B1* | 8/2002 | Liu | ................... | H01L 21/76835 |
| | | | | 438/689 |
| 6,479,898 B1* | 11/2002 | Hopper | ............. | H01L 21/32051 |
| | | | | 257/E21.295 |
| 6,509,262 B1* | 1/2003 | Lopatin | ............. | H01L 21/76862 |
| | | | | 257/E21.174 |
| 6,555,909 B1* | 4/2003 | Lopatin | ............. | H01L 23/53238 |
| | | | | 257/761 |
| 6,589,874 B2* | 7/2003 | Andricacos | ....... | H01L 21/76858 |
| | | | | 257/E21.585 |
| 6,686,662 B2* | 2/2004 | Merchant | .......... | H01L 21/76814 |
| | | | | 257/750 |
| 7,067,407 B2* | 6/2006 | Kostamo | ................ | C23C 16/40 |
| | | | | 438/650 |
| 7,199,040 B2* | 4/2007 | Yang | ................. | H01L 21/76862 |
| | | | | 438/622 |
| 7,955,979 B2* | 6/2011 | Kostamo | ........... | H01L 21/76843 |
| | | | | 257/E21.585 |
| 8,587,128 B2* | 11/2013 | Yang | ................... | H01L 21/2855 |
| | | | | 257/774 |
| 9,773,806 B1* | 9/2017 | Lee | ................... | G11C 16/0466 |
| 2006/0157820 A1* | 7/2006 | Bouche | .............. | H10B 12/038 |
| | | | | 257/532 |
| 2010/0090308 A1* | 4/2010 | Sardana | ............. | H01L 23/5223 |
| | | | | 257/532 |
| 2010/0108291 A1 | 5/2010 | Onnerud et al. | | |
| 2017/0299635 A1 | 10/2017 | Dünsbier | | |

OTHER PUBLICATIONS

EPO; Extended European Search Report issued in EP Patent Application No. 22151322.9, dated Jul. 8, 2022; 9 pages.

* cited by examiner

TECHNOLOGIES FOR POWER TUNNELS ON CIRCUIT BOARDS

BACKGROUND

Printed circuit boards (PCBs) are ubiquitous in modern electronics. PCBs can have a large number of connections in multiple layers connecting many different components. Traces on PCBs can both provide power to components as well as data connectivity. In some cases, traces may be relatively wide in order to carry a sufficient amount of current to power certain components connected to the PCBs. The wide traces required to carry power can increase the required size of a PCB, increasing the size of the device or limiting the size of other components due to space constraints.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

Figure 1:
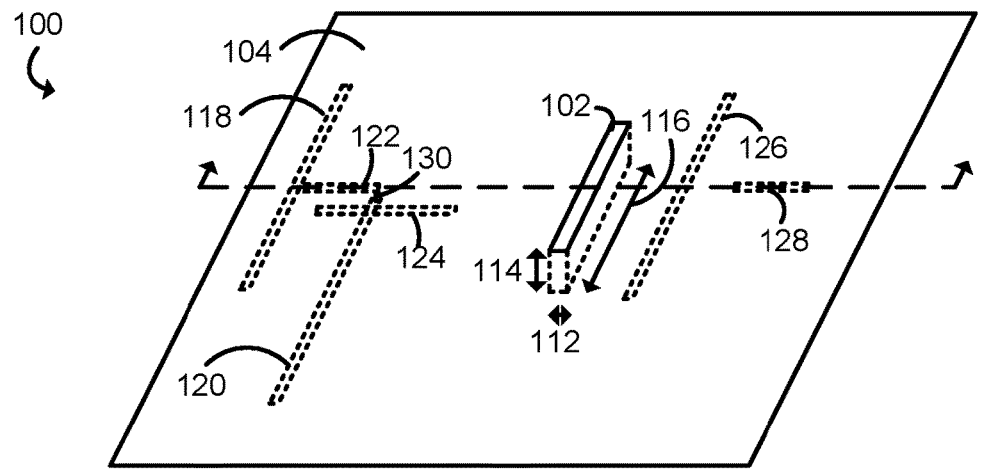
FIG. 1 is a perspective view of one embodiment of PCB with a power tunnel.
Figure 2:
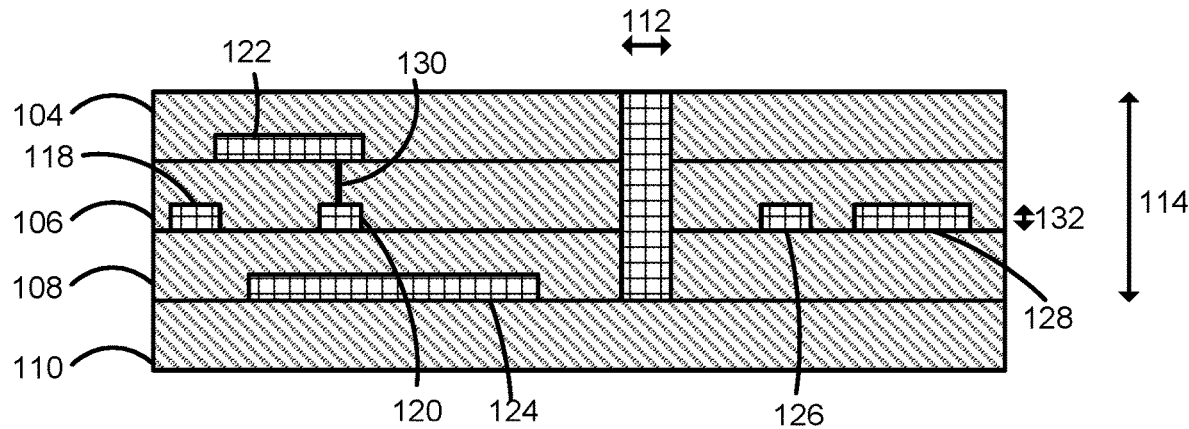
FIG. 2 is a cross-section view of the PCB of FIG. 1.

Referring to FIG. 1, an embodiment of a circuit board 100 includes a power tunnel 102. A cross-section view of the circuit board 100 is shown in FIG. 2. The illustrative power tunnel 102 extends through multiple layers of the circuit board 100. In particular, the power tunnel 102 extends from a top non-conductive layer 104, through a second non-conductive layer 106, through a third non-conductive layer 108, and contacts a fourth non-conductive layer 110. The power tunnel 102 has a width 112, a depth 114, and a length 116. By extending through several layers, the power tunnel 102 can have a large cross-sectional area with a relatively small width 112. Such a large cross-sectional area allows the power tunnel 102 to carry large amounts of current, such as may be used to power various components in a laptop, tablet, mobile phone, etc.

The depth 114 of the power tunnel may have any suitable depth. In the illustrative embodiment, the depth 114 of the power tunnel can extend through any or all of the non-conductive layers 106-110, allowing the depth of the power tunnel 114 to be a depth equal to or slightly greater than the thickness of the circuit board 100. For example, the depth 114 may be any suitable value from 50 micrometers to 5 millimeters. The width 112 of the power tunnel 102 may be any suitable width, such as any width from 100 micrometers to 5 millimeters. The length 116 of the power tunnel 102 may be any suitable length, such as 1-50 millimeters. Additionally, although the power tunnel 102 is depicted as a straight line, it should be appreciated that a power tunnel 102 may have any suitable non-linear shape, and may curve, bend, turn, etc., in any suitable direction. In some cases, the cross-section of a power tunnel 102 may change shape, such as changing a height 114 or width 112 along the length of the power tunnel 102.

In the illustrative embodiment, the power tunnel is made out of copper. Additionally or alternatively, in other embodiments, the power tunnel 102 may be made out of aluminum, gold, or any other suitable conductor.

Each of the illustrative non-conducting layers 104, 106, 108, and 110 is a fiberglass board made of glass fibers and a resin, such as FR-4. In other embodiments, any suitable non-conducting layers may be used. The thickness of each non-conducting layer 104-110 can be any suitable thickness, such as 50 to 500 micrometers. The circuit board 100 may have any suitable number of non-conducting layers, such as 1-10. The total thickness of the circuit board 100 may be any suitable thickness, such as 100 micrometers to 5 millimeters. The non-conducting layers 104-110 and the circuit board 100 can have any suitable length and width, such as 5-500 millimeters. Although shown as a square, it should be appreciated that the circuit board 100 may be any suitable shape and may have protrusions, cutouts, etc., in order to accommodate, fit, or touch other components of a device. In the illustrative embodiment, the circuit board 100 and each layer 104-110 are planar. In other embodiments, some or all of the circuit board 100 and layers 104-110 may be non-planar.

The circuit board 100 may include several other traces, such as trances 118, 120, 122, 124, 126, and 128. In some embodiments, the circuit board 100 may include one or more vias, such as a via 130 connecting trace 120 and trace 122. Each trace 118-128 may have any suitable width or height, such as any height from 5 micrometers to 40 micrometers. In the illustrative embodiment, the height of each trace 118-128 is 20-25 micrometers.

It should be appreciated that other traces, such as trace 124, only has a height 132 that is a fraction of a single non-conductive layer. In contrast, the power tunnel 102 extends all the way through three non-conductive layers, giving the power tunnel 102 that extends through three layers a height 114 greater than the sum of the heights of traces on three layers.

It should be appreciated that the cross-sectional area of the power tunnel 102 impacts the temperature ride of the power tunnel 102 as current is passed through the power tunnel 102. For example, in one embodiment and in accordance with IPC-2221, the relationship between the cross-sectional area A in square mils (i.e., square one-thousandths of an inch) of the power tunnel 102, the current/through the power tunnel 102 in amps, and the temperature rise $T_R$ in degrees Celsius can be expressed as:

$$A = \left(\frac{I}{k \times T_R^b}\right)^{1/c},$$

where for an internal layer, k=0.024, b=0.44, and c=0.725, and for an external layer, k=0.048, b=0.44, and c=0.725.

It should be appreciated that, in some embodiments, the area required of the trace or traces carrying a large amount of current (such as traces carrying current between a battery or other power source and the components that consume large amounts of power) must be fairly high. Additionally, if the height of those traces is limited to a relatively small value, the width of those traces must also be fairly high. In some embodiments, the size of the circuit board 100 may be at least partially limited by the required width of the traces carrying power to components.

However, with a power tunnel, such as the power tunnel 102, the trace depth (or height) 114 can be relatively large compared to the height 132 of a typical trace. As such, the width of the power tunnel 102 can be significantly smaller in order to carry the same amount, which can, in turn, reduce the overall size of the circuit board 100 for a device, freeing up space for, e.g., a larger battery or an overall smaller device.

For example, in one embodiment, one design of a circuit board 100 may have two traces that together carry the current used to power a device, with one trace being above the other. The first trace thickness is 25 micrometers, the second trace is 20 micrometers, and the non-conductive layer between the traces is 50 micrometers, giving a total thickness of the traces of 45 micrometers. In order to carry a current of 3 amps at a temperature rise of 25° Celsius, each trace would need to have a width of 2.77 millimeters, using the formula presented above.

However, if a power tunnel was used between the two traces, then the conductive layer of 50 micrometers would be effectively replaced with additional conductor, increasing the height of the traces carrying the current from 45 micrometers to 95 micrometers. This increase would reduce the required width of the trace from 2.77 millimeters to 1.31 millimeters, a reduction of 53%. In some embodiments, the reduced with of the trace may be used to shorten other traces, such as I/O paths. Additionally or alternatively, in some embodiments, the width of the power tunnel may be increased such that the cross-section of the power tunnel is greater than what the traces otherwise would be, reducing the voltage drop across the power tunnel and reducing the heat generated in the power tunnel. It should be appreciated that, in some embodiments, the power tunnel may act as a power plane and/or a ground plane.

Figure 3A:
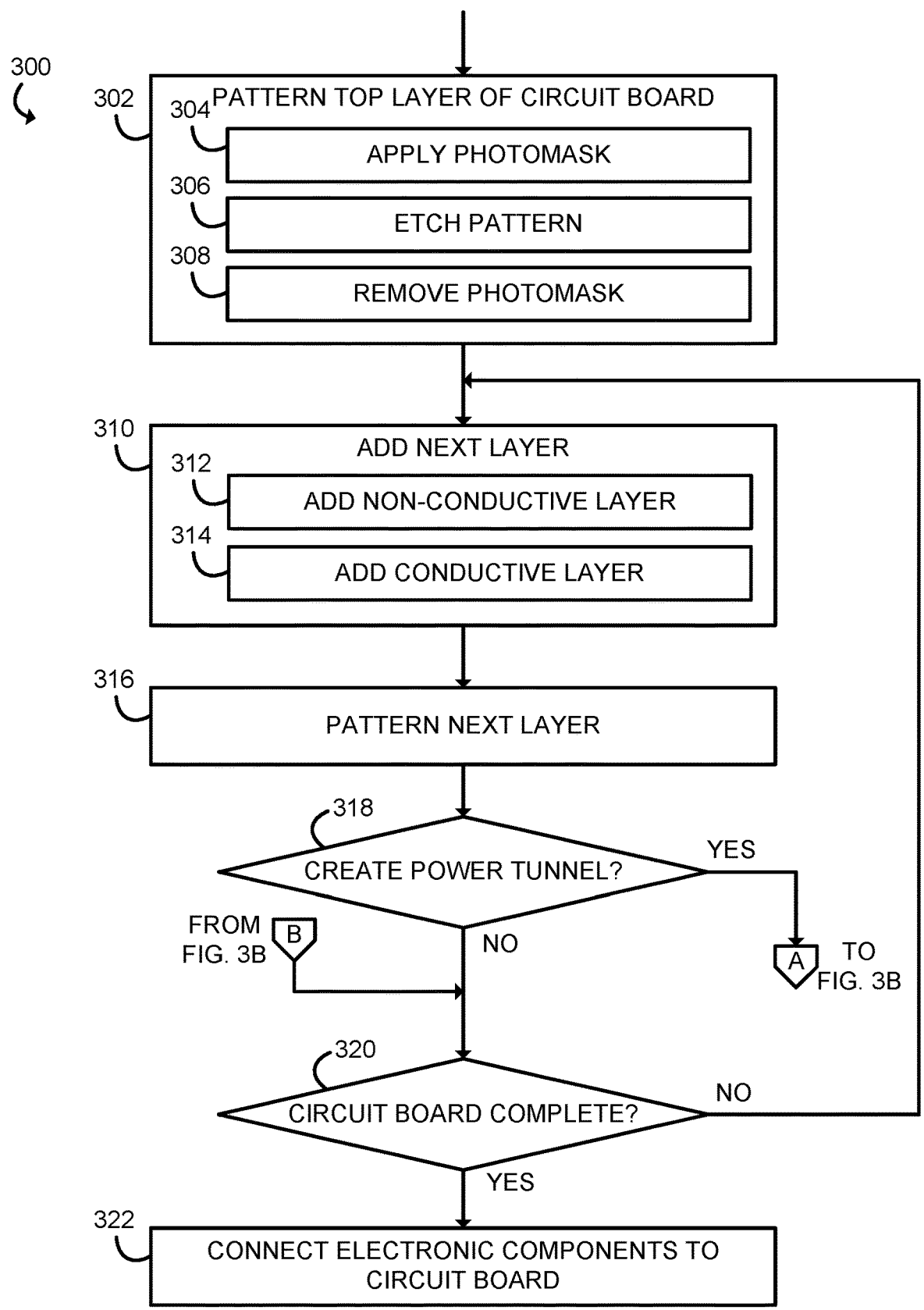
FIGS. 3A & 3B are a simplified flow diagram of at least one embodiment of a method for manufacturing the PCB of FIG. 1.
Figure 4:
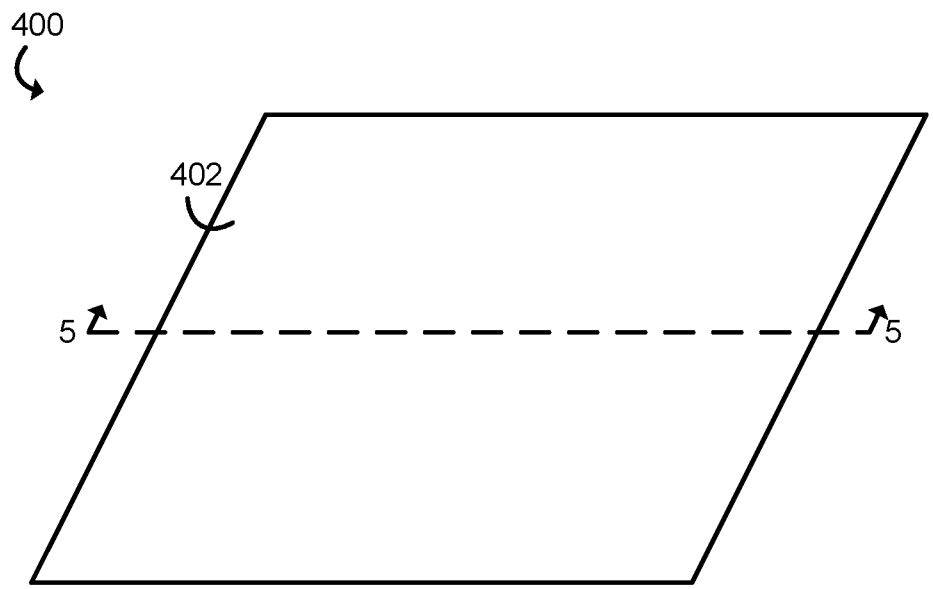
FIG. 4 is a perspective view of a first stage of manufacture for a PCB.
Figure 5:
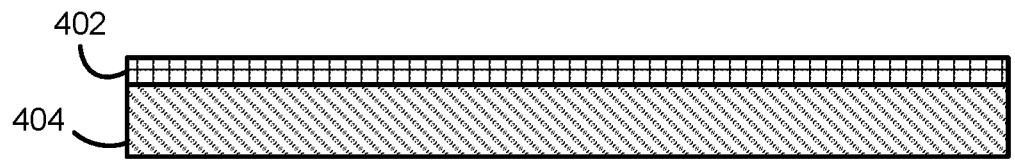
FIG. 5 is a cross-section view of the PCB of FIG. 4.

Referring now to FIG. 3A, in one embodiment, a method 300 for manufacturing a circuit board is presented. The method 300 may be performed in any suitable manner, such as using any suitable combination of machines, human operators, robots, etc. The method 300 begins in block 302, in which a top layer of a circuit board, such as circuit board 400 in FIG. 4, is patterned. The circuit board 400 in FIG. 4 initially has a single non-conductive layer 404 with a conductive layer 402 on top. The conductive layer 402 may be added in any suitable manner, such as by adhering a copper foil onto the non-conductive layer 404, growing the conductive layer 402 on top of the non-conductive layer 404, etc. In some embodiments, the starting non-conductive layer 404 may have a conductive layer on top and bottom. The non-conductive layer 404 may be similar to the non-conductive layers 104-110 described above. In some embodiments, the starting non-conductive layer 404 may be called a core.

Figure 6:
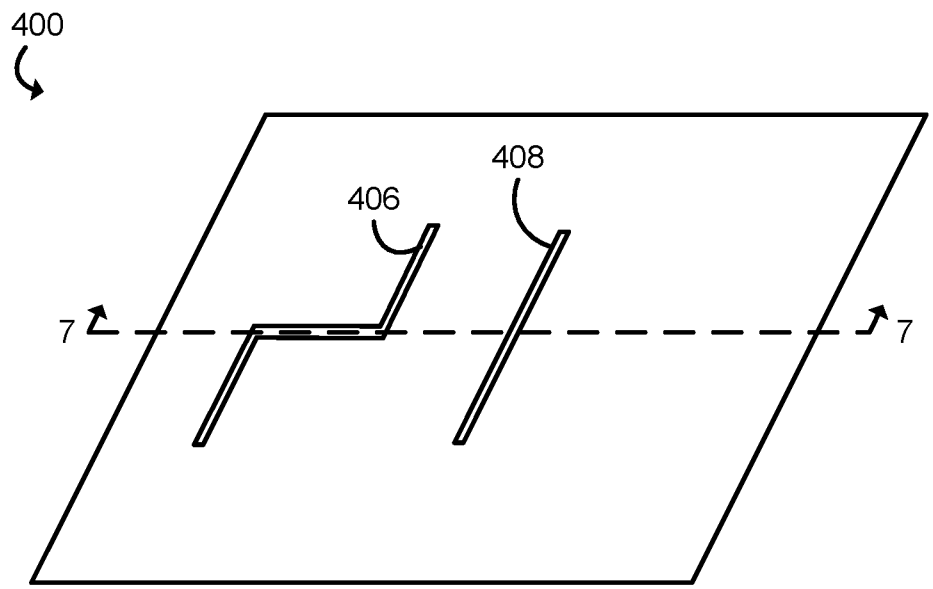
FIG. 6 is a perspective view of a first stage of manufacture for a PCB.
Figure 7:
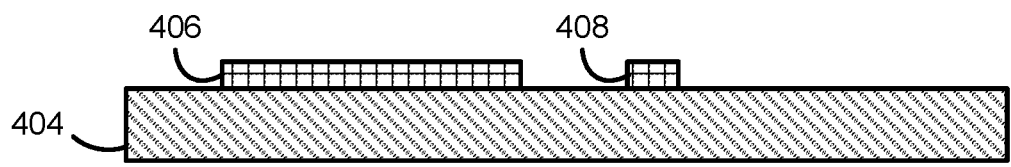
FIG. 7 is a cross-section view of the PCB of FIG. 6.
Figure 8:
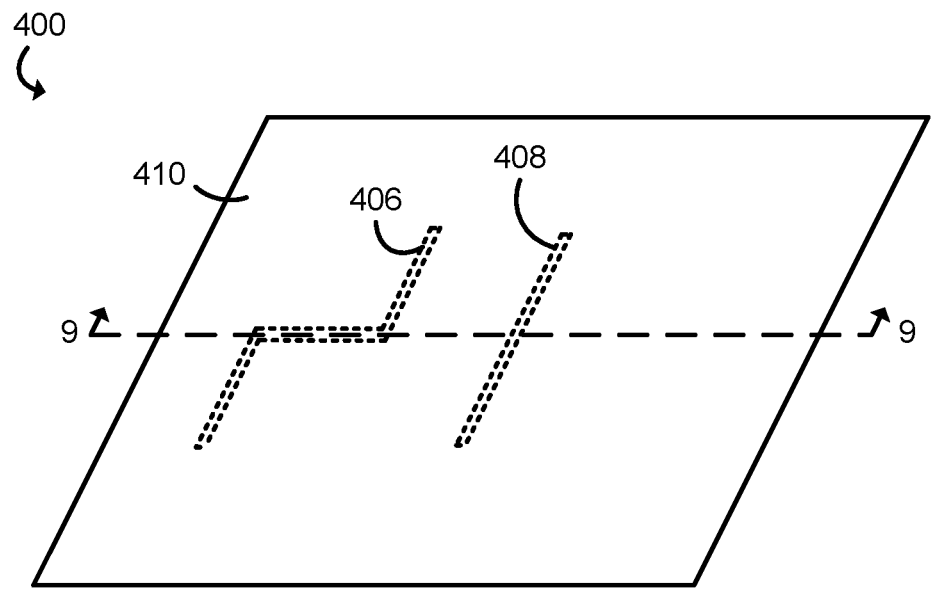
FIG. 8 is a perspective view of a second stage of manufacture for a PCB.

The conductive layer 402 may be patterned in any suitable way. In the illustrative embodiment, a photomask is applied on top of the conductive layer 402 in block 304. A pattern is etched in block 306, removing the parts of the conductive layer 402 not covered with the mask. The photomask can then be removed in block 308, leaving traces such as traces 406 and 408 shown in FIGS. 6 & 7.

In block 310, an additional layer is added to the circuit board 400. A non-conductive layer 412 is added in block 312 (see FIGS. 9 & 10). In the illustrative embodiment, a non-conductive layer 412 is added by applying a "prepreg," which may be a glass fiber weave or cloth impregnated with a resin bonding agent. A conductive layer 410 may be added in any suitable manner, such as by adhering a copper foil onto the non-conductive layer 412, growing the conductive layer 410 on top of the non-conductive layer 412, etc.

After a new layer is applied, the new layer can be patterned in block 316. The new layer can be patterned similarly to the layer 402 is patterned in block 302.

Figure 3B:
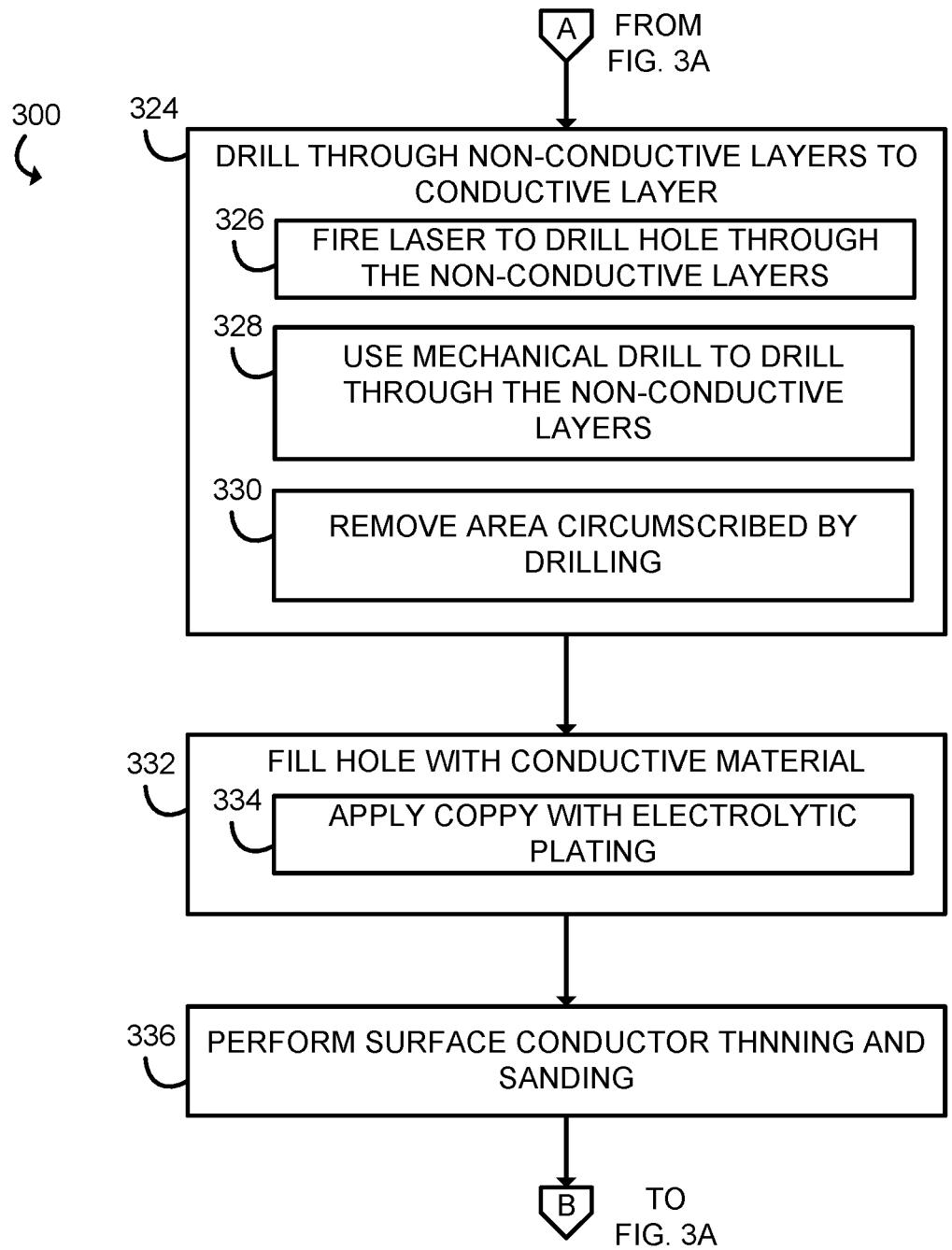
Figure 9:
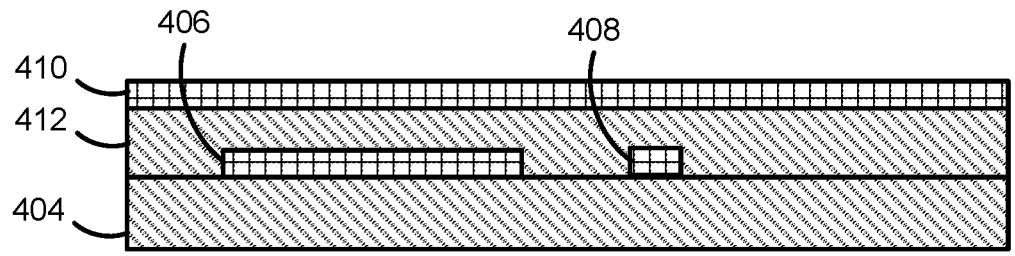
FIG. 9 is a cross-section view of the PCB of FIG. 8.
Figure 10:
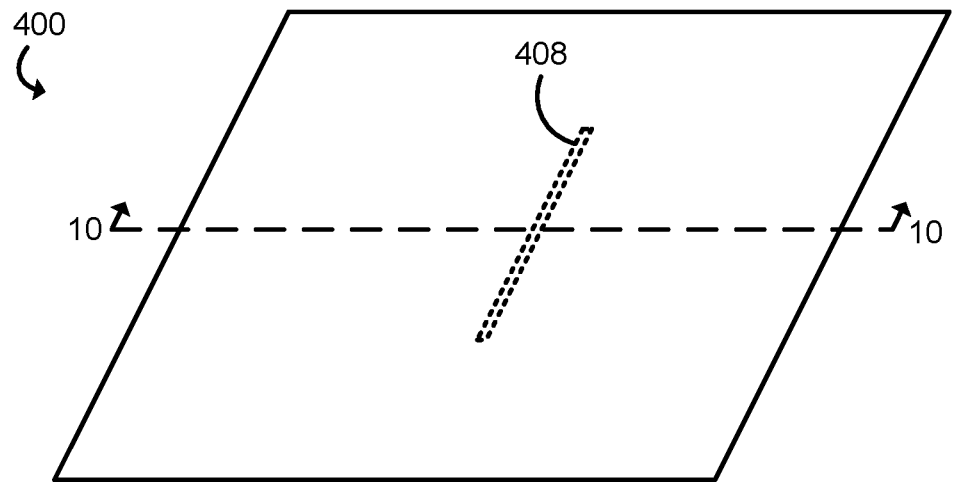
FIG. 10 is a perspective view of a third stage of manufacture for a PCB.
Figure 11:
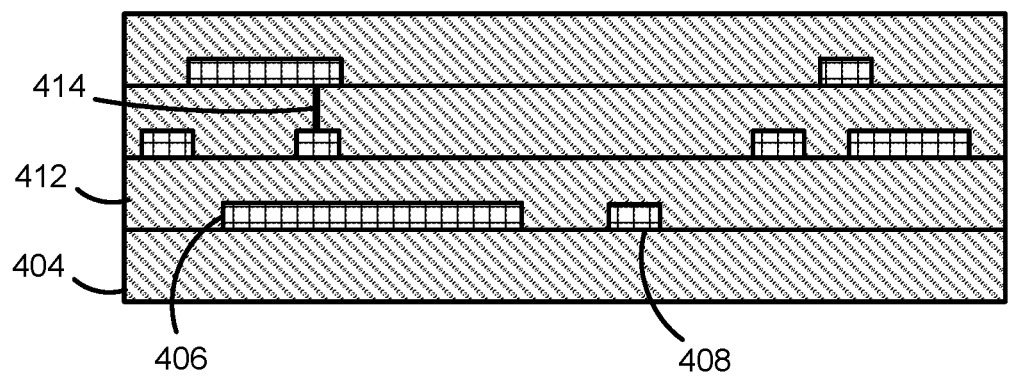
FIG. 11 is a cross-section view of the PCB of FIG. 10.
Figure 12:
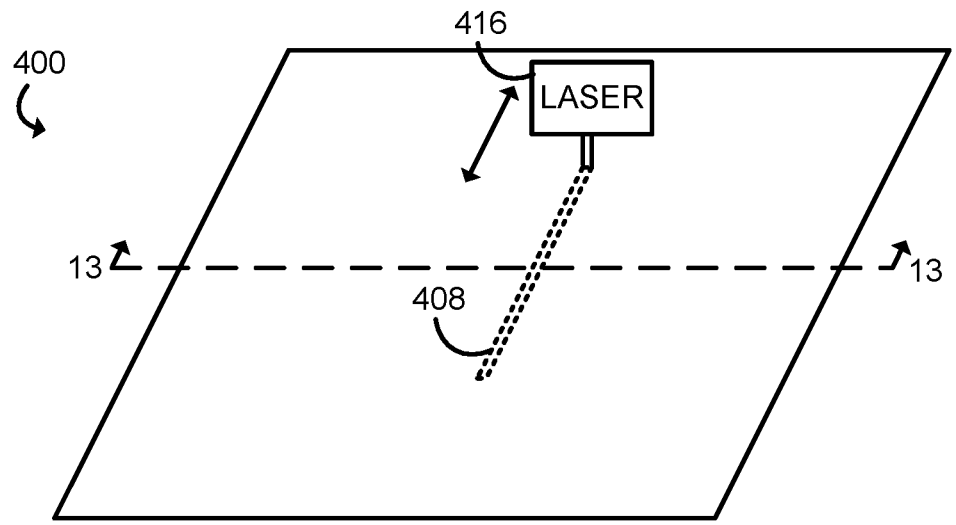
FIG. 12 is a perspective view of a fourth stage of manufacture for a PCB.

In block 318, if a power tunnel is to be created, the method 300 jumps to block 324 in FIG. 3B to begin drilling on the circuit board 400. If a power tunnel is not to be created, the method 300 continues to block 320. If the circuit board is not complete, the method loops back to block 310 to add a new non-conductive layer. Multiple additional layers can be added and patterned. For example, after the additional of several layers, the circuit board 400 may be in the form shown in FIGS. 9 & 10. In FIG. 9, trace 408 is shown embedded in the circuit board 400. Additional traces embedded in the board are not shown in FIG. 9 but are shown in FIG. 10, which shows a cross-section of FIG. 9. In addition to traces, the circuit board 400 may include other features, such as one or more vias 414 connecting two traces.

Figure 13:
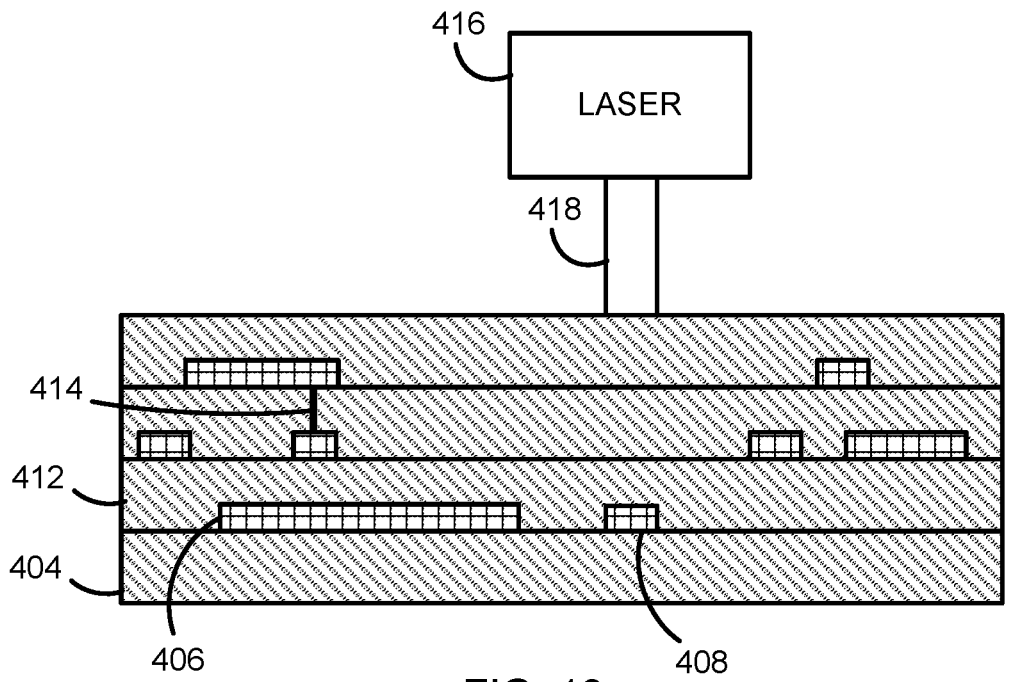
FIG. 13 is a cross-section view of the PCB of FIG. 12.
Figure 14:
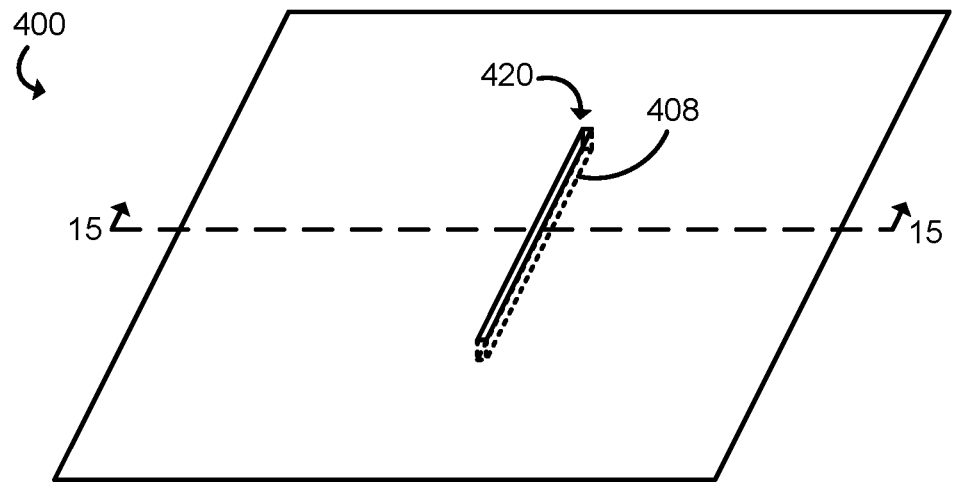
FIG. 14 is a perspective view of a fifth stage of manufacture for a PCB.
Figure 15:
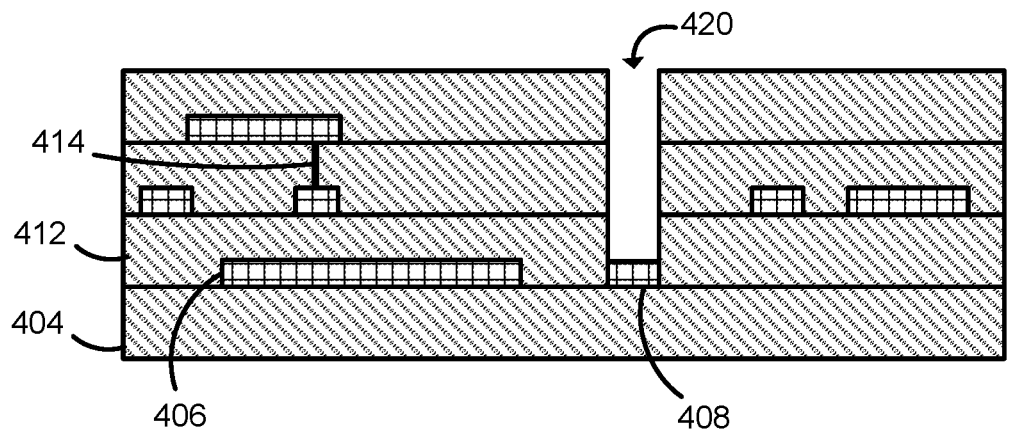
FIG. 15 is a cross-section view of the PCB of FIG. 14.

Referring back to block 318, if a power tunnel is to be created, method 300 jumps to block 324 in FIG. 3B. In block 324, a hole is drilled through non-conductive layers to a conductive trace. In the illustrative embodiment, a laser 416 is fired at the circuit board 300 to create a hole 420 above a trace 408 in block 326. As shown in FIG. 13, the laser 416 can be scanned along the circuit board 400 above the trace 408. In one embodiment, a laser beam 418 may create a hole 420 approximately equal to the width of a trace 408, as shown in FIGS. 14 & 15. In other embodiments, a laser 416 may be scanned across the width of a trace 408 to remove all of the non-conductive layers above the trace 408. In other embodiments, the laser 416 may be moved around an outline of the trace 408, separating a chunk of the non-conductive layers. In the illustrative embodiment, the laser 416 is tuned to, e.g., a particular wavelength, power, and/or focusing spot such that the laser 416 removes the non-conductive layers but does not remove the trace 408. For example, in one embodiment, a laser 416 may be used that is absorbed by the non-conductive layers but is reflected by the trace 408. As such, the laser 416 will drill down to the trace 408 but will not drill into or past the trace 408. Such an approach can improve the precision of the drilling by allowing the trace 408 to act as a stop to the laser beam 418.

In other embodiments, a mechanical drill may be used to drill through the non-conductive layers in block 328. The mechanical drill may drill out all of the non-conductive layers above the trace 408 or may be moved around an outline of the trace 408. In some embodiments, a mechanical drill may be used to create a hole 420 that does not have a trace 408 at the bottom, as the trace 408 may not be necessary to act as a stop. It should be appreciated that, in some embodiments, a precision of a mechanical drill may be lower than that of a laser 416 when used with a trace 408 as a stop. For example, the precision of a depth of a hole drilled by mechanical drill may be, e.g., 50-70 micrometers, while the precision of a depth of a hole drilled by a laser 416 with a trace 408 as a backstop can be less than the height of the trace 408 (e.g., less than 20 micrometers).

In some embodiments, after drilling the holes, the circuit board 400 may be cleaned, such as by applying one or more chemicals or solvents, by performing an ultrasound cleaning, etc.

In the illustrative embodiment, the hole 420 is drilled from the top of the circuit board 400, as shown in FIGS. 14 & 15. It should be appreciated that, in other embodiments, a hole may be drilled from the bottom of the circuit board 400. For example, a circuit board may have a power tunnel extending from the top surface to an intermediate layer as well as a power tunnel extending from a bottom surface to an intermediate layer.

In some embodiments, such as those in which the laser 416 or mechanical drill is used to create a hole that outlines the trace 408, the area circumscribed by drilling may be removed in block 330. The area may be removed in any suitable manner, such as inserting a wedge between the area and circumscribed by the drilling and the trace 408.

Figure 16:
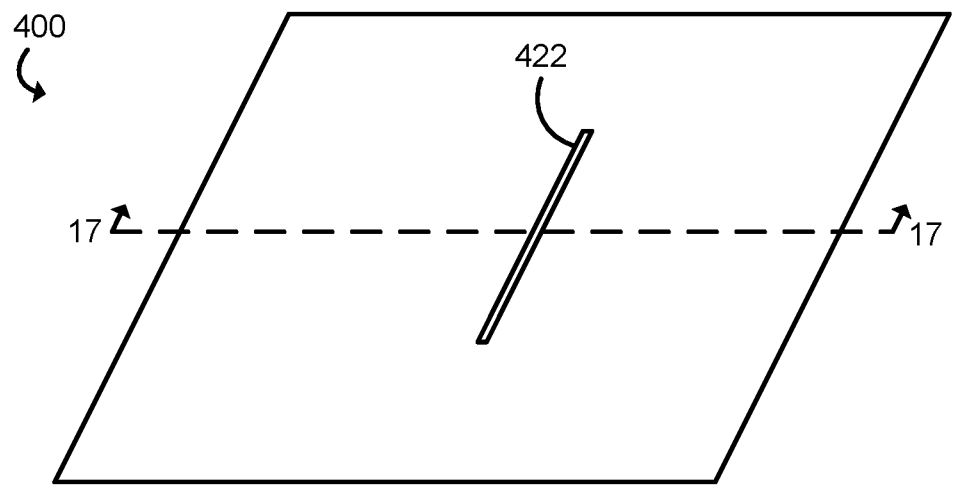
FIG. 16 is a perspective view of a sixth stage of manufacture for a PCB.
Figure 17:
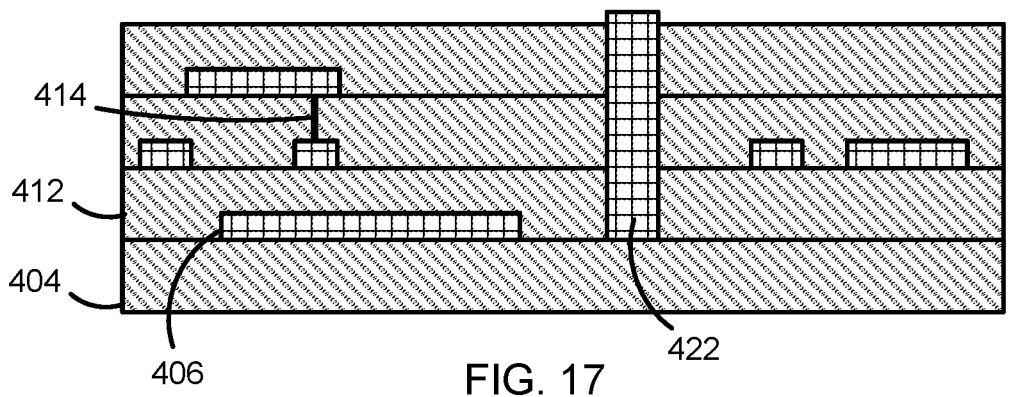
FIG. 17 is a cross-section view of the PCB of FIG. 16.

In block 332, the hole 420 can be filled with a conductive material. In the illustrative embodiment, the hole 420 is filled with copper using electrolytic copper plating in block 334. In other embodiments, conductor may be added to the hole in any suitable manner, such as by melting a low-melting-point conductor into the hole 420. In some embodiments, the conductor may not be copper but may be gold, aluminum, etc. Once the hole 420 is filled, the circuit board 400 now has a power tunnel 422, as shown in FIGS. 16 & 17. Depending on how the hole 420 is filled, in some embodiments, a void may occur in the power tunnel 422.

Figure 18:
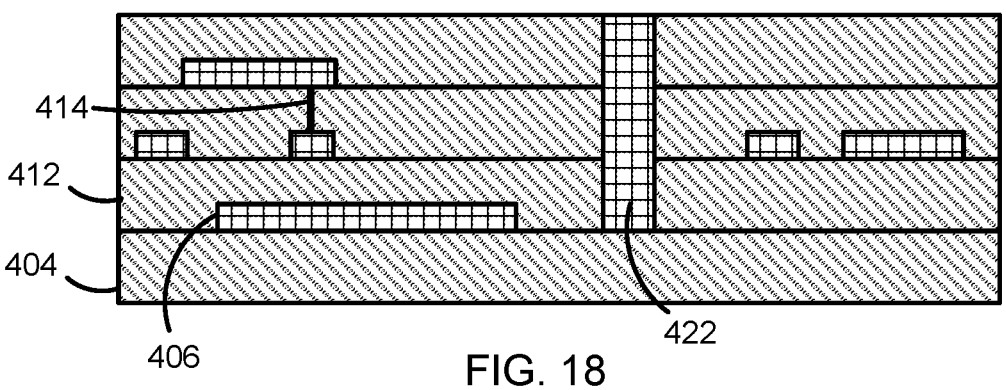
FIG. 18 is a cross-section view of the PCB of FIG. 16 after surface conductor thinning and sanding.

In some embodiments, the power tunnel 422 may past the surface of the circuit board 400, such as after electrolytic plating. In such embodiments, surface conductor thinning and/or sanding may be performed in block 336 to create a power tunnel 422 flush with the surface of the circuit board 400 as shown in FIG. 18.

The method 300 then loops back to block 320 in FIG. 3A. In block 320, if the circuit board 400 is not complete, the method 400 loops back to block 310 to add a new layer. It should be appreciated that, in some embodiments, a new layer may be added above a power tunnel. If the circuit board 400 is complete, the method 300 continues from block 320 to block 322, in which various electronic components can be connected to the circuit board 400, such as capacitors, integrated circuits, computer chips, a battery, a display, etc.

It should be appreciated that the flowchart and description of the method 300 is a simplified description and that, in practice, methods 300 may include several additional steps, such as adding solder, adding solder mask, adding plating to traces, applying various chemicals, applying heat treatment, etc. Additionally or alternatively, certain aspects of the method 300 may be performed differently. For example, rather than subtractive patterning of the traces (i.e., by applying a foil and then removing unwanted parts), additive patterned of the traces may be performed.

Figure 19:
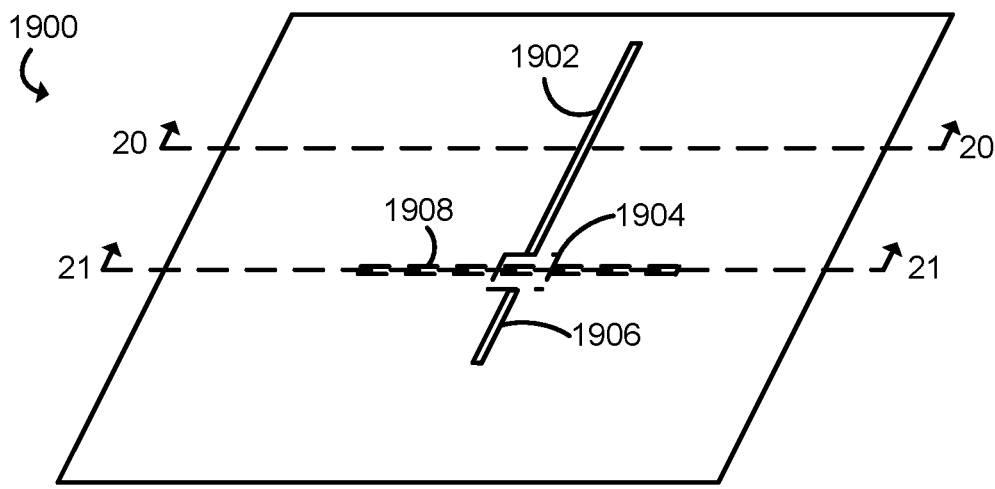
FIG. 19 is a perspective view of one embodiment of a PCB with a power tunnel.
Figure 20:
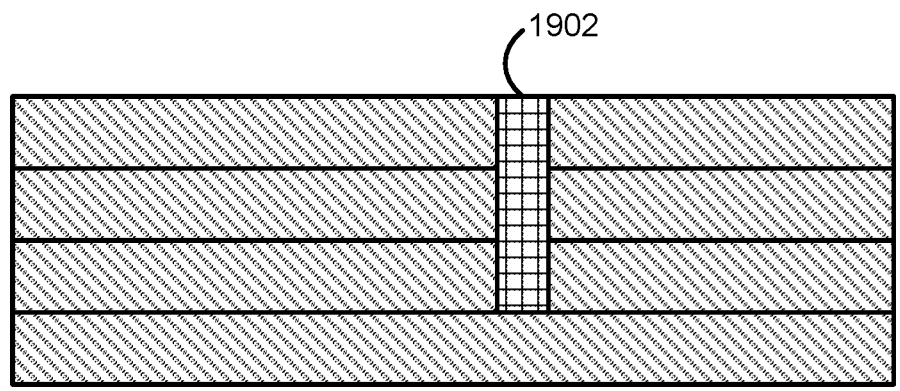
FIG. 20 is a cross-section view of the PCB of FIG. 19.
Figure 21:
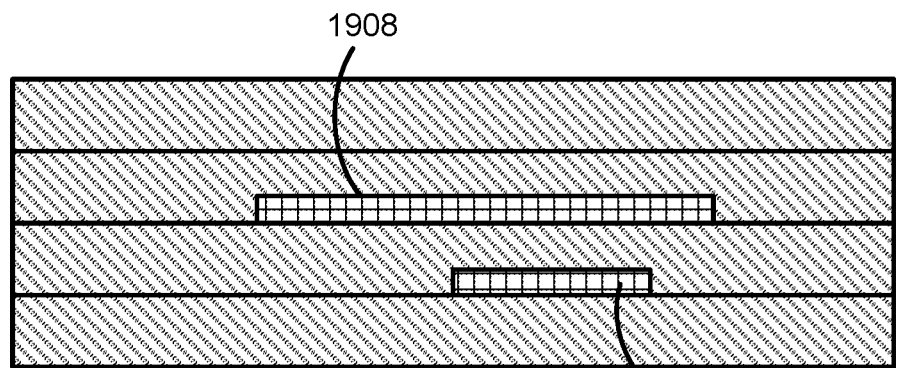
FIG. 21 is a cross-section view of the PCB of FIG. 20.

It should further be appreciated that, in some embodiments, a power tunnel may change shape or may be discontinuous. For example, referring to FIGS. 19-21, a circuit board 1900 may include a first power tunnel 1902 connected to a second power tunnel 1904 by a trace 1904. FIG. 20 shows the cross-section of the power tunnel 1902 of FIG. 19, and the cross-section of the power tunnel 1906 would be similar. However, in order to allow a trace 1908 to cross the power tunnel, the power tunnel is collapsed into a single trace 1904 that is wider than the power tunnel 1902, 1906. Such an approach may allow other traces to cross a power tunnel without contacting it.

Figure 22:
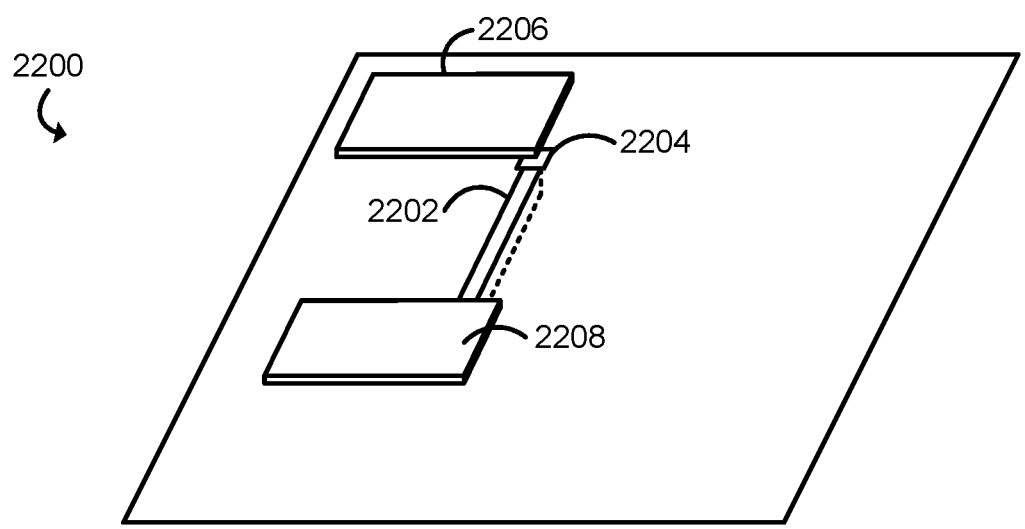
FIG. 22 is a perspective view of one embodiment of a PCB with a power tunnel and additional components.

Referring now to FIG. 22, in one embodiment, a circuit board 220 includes a power tunnel 2202, which may be similar to the power tunnel 102 or the power tunnel 408. At one end, the power tunnel 408 is connected to a pad 2204, such as a solder pad. The power tunnel 408 connects a first component 2206 to a second component 2208. The first component 2206 may be a battery or other power source, and the second component 2208 may be any suitable component consuming power, such as a processor chip, a memory chip, a system-on-a-chip (SoC), a display, a communication circuit, etc. It should be appreciated that the circuit board 400 can, of course, include other traces and connected components not shown in FIG. 22.

Figure 23:
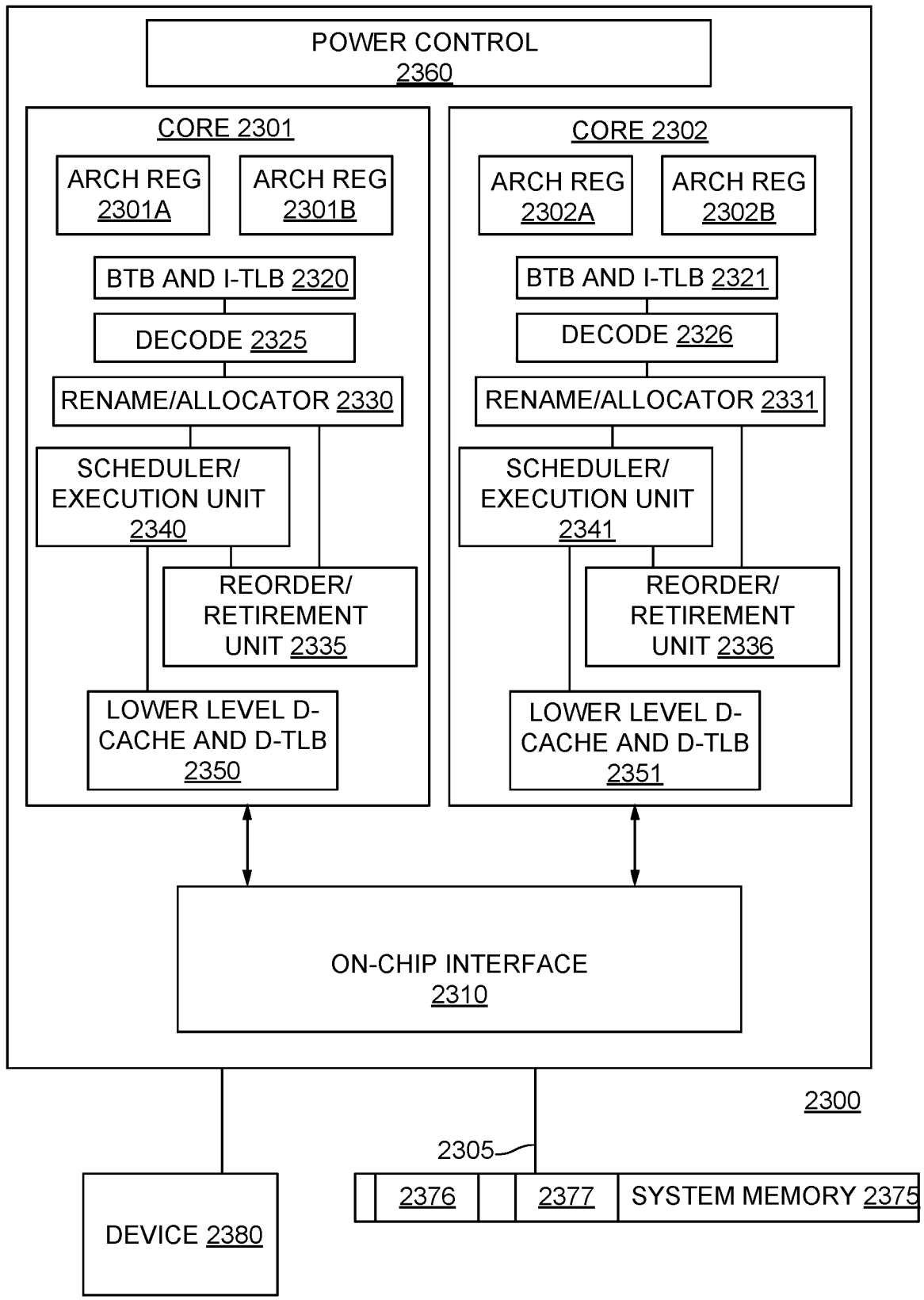
FIG. 23 illustrates an embodiment of a block diagram for a computing system including a multicore processor.

Referring to FIG. 23, an embodiment of a block diagram for a computing system including a multicore processor is depicted. Processor 2300 includes any processor or processing device, such as a microprocessor, an embedded processor, a digital signal processor (DSP), a network processor, a handheld processor, an application processor, a co-processor, a system on a chip (SOC), or other device to execute code. Processor 2300, in one embodiment, includes at least two cores-core 2301 and 2302, which may include asymmetric cores or symmetric cores (the illustrated embodiment). However, processor 2300 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 2300, as illustrated in FIG. 23, includes two cores-core 2301 and 2302. Here, core 2301 and 2302 are considered symmetric cores, i.e. cores with the same configurations, functional units, and/or logic. In another embodiment, core 2301 includes an out-of-order processor core, while core 2302 includes an in-order processor core. However, cores 2301 and 2302 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 2301 are described in further detail below, as the units in core 2302 operate in a similar manner in the depicted embodiment.

As depicted, core 2301 includes two hardware threads 2301a and 2301b, which may also be referred to as hardware thread slots 2301a and 2301b. Therefore, software entities, such as an operating system, in one embodiment potentially view processor 2300 as four separate processors, i.e., four logical processors or processing elements capable of executing four software threads concurrently. As alluded to above, a first thread is associated with architecture state registers 2301a, a second thread is associated with architecture state registers 2301b, a third thread may be associated with architecture state registers 2302a, and a fourth thread may be associated with architecture state registers 2302b. Here, each of the architecture state registers (2301a, 2301b, 2302a, and 2302b) may be referred to as processing elements, thread slots, or thread units, as described above. As illustrated, architecture state registers 2301a are replicated in architecture state registers 2301b, so individual architecture states/contexts are capable of being stored for logical processor 2301a and logical processor 2301b. In core 2301, other smaller resources, such as instruction pointers and renaming logic in allocator and renamer block 2330 may also be replicated for threads 2301a and 2301b. Some resources, such as re-order buffers in reorder/retirement unit 2335, ILTB 2320, load/store buffers, and queues may be shared through partitioning. Other resources, such as general purpose internal registers, page-table base register(s), low-level data-cache and data-TLB 2315, execution unit(s) 2340, and portions of out-of-order unit 2335 are potentially fully shared.

Processor 2300 often includes other resources, which may be fully shared, shared through partitioning, or dedicated by/to processing elements. In FIG. 23, an embodiment of a purely exemplary processor with illustrative logical units/resources of a processor is illustrated. Note that a processor may include, or omit, any of these functional units, as well as include any other known functional units, logic, or firmware not depicted. As illustrated, core 2301 includes a simplified, representative out-of-order (OOO) processor core. But an in-order processor may be utilized in different embodiments. The OOO core includes a branch target buffer 2320 to predict branches to be executed/taken and an instruction-translation buffer (I-TLB) 2320 to store address translation entries for instructions.

Core 2301 further includes decode module 2325 coupled to fetch unit 2320 to decode fetched elements. Fetch logic, in one embodiment, includes individual sequencers associated with thread slots 2301a, 2301b, respectively. Usually core 2301 is associated with a first ISA, which defines/specifies instructions executable on processor 2300. Often machine code instructions that are part of the first ISA include a portion of the instruction (referred to as an opcode), which references/specifies an instruction or operation to be performed. Decode logic 2325 includes circuitry that recognizes these instructions from their opcodes and passes the decoded instructions on in the pipeline for processing as defined by the first ISA. For example, as discussed in more detail below decoders 2325, in one embodiment, include logic designed or adapted to recognize specific instructions, such as transactional instruction. As a result of the recognition by decoders 2325, the architecture or core 2301 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 2326, in one embodiment, recognize the same ISA (or a subset thereof). Alternatively, in a heterogeneous core environment, decoders 2326 recognize a second ISA (either a subset of the first ISA or a distinct ISA).

In one example, allocator and renamer block 2330 includes an allocator to reserve resources, such as register files to store instruction processing results. However, threads 2301a and 2301b are potentially capable of out-of-order execution, where allocator and renamer block 2330 also reserves other resources, such as reorder buffers to track instruction results. Unit 2330 may also include a register renamer to rename program/instruction reference registers to other registers internal to processor 2300. Reorder/retirement unit 2335 includes components, such as the reorder buffers mentioned above, load buffers, and store buffers, to support out-of-order execution and later in-order retirement of instructions executed out-of-order.

Scheduler and execution unit(s) block 2340, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 2350 are coupled to execution unit(s) 2340. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 2301 and 2302 share access to higher-level or further-out cache, such as a second level cache associated with on-chip interface 2310. Note that higher-level or further-out refers to cache levels increasing or getting further way from the execution unit(s). In one embodiment, higher-level cache is a last-level data cache—last cache in the memory hierarchy on processor 2300—such as a second or third level data cache. However, higher level cache is not so limited, as it may be associated with or include an instruction cache. A trace cache—a type of instruction cache—instead may be coupled after decoder 2325 to store recently decoded traces. Here, an instruction potentially refers to a macro-instruction (i.e. a general instruction recognized by the decoders), which may decode into a number of micro-instructions (micro-operations).

In the depicted configuration, processor 2300 also includes on-chip interface module 2310. Historically, a memory controller, which is described in more detail below, has been included in a computing system external to processor 2300. In this scenario, on-chip interface 2310 is to communicate with devices external to processor 2300, such as system memory 2375, a chipset (often including a memory controller hub to connect to memory 2375 and an I/O controller hub to connect peripheral devices), a memory controller hub, a northbridge, or other integrated circuit. And in this scenario, bus 2305 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 2375 may be dedicated to processor 2300 or shared with other devices in a system. Common examples of types of memory 2375 include DRAM, SRAM, non-volatile memory (NV memory), and other known storage devices. Note that device 2380 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 2300. For example in one embodiment, a memory controller hub is on the same package and/or die with processor 2300. Here, a portion of the core (an on-core portion) 2310 includes one or more controller(s) for interfacing with other devices such as memory 2375 or a graphics device 2380. The configuration including an interconnect and controllers for interfacing with such devices is often referred to as an on-core (or un-core configuration). As an example, on-chip interface 2310 includes a ring interconnect for on-chip communication and a high-speed serial point-to-point link 2305 for off-chip communication. Yet, in the SOC environment, even more devices, such as the network interface, co-processors, memory 2375, graphics processor 2380, and any other known computer devices/interface may be integrated on a single die or integrated circuit to provide small form factor with high functionality and low power consumption.

In one embodiment, processor 2300 is capable of executing a compiler, optimization, and/or translator code 2377 to compile, translate, and/or optimize application code 2376 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 24:
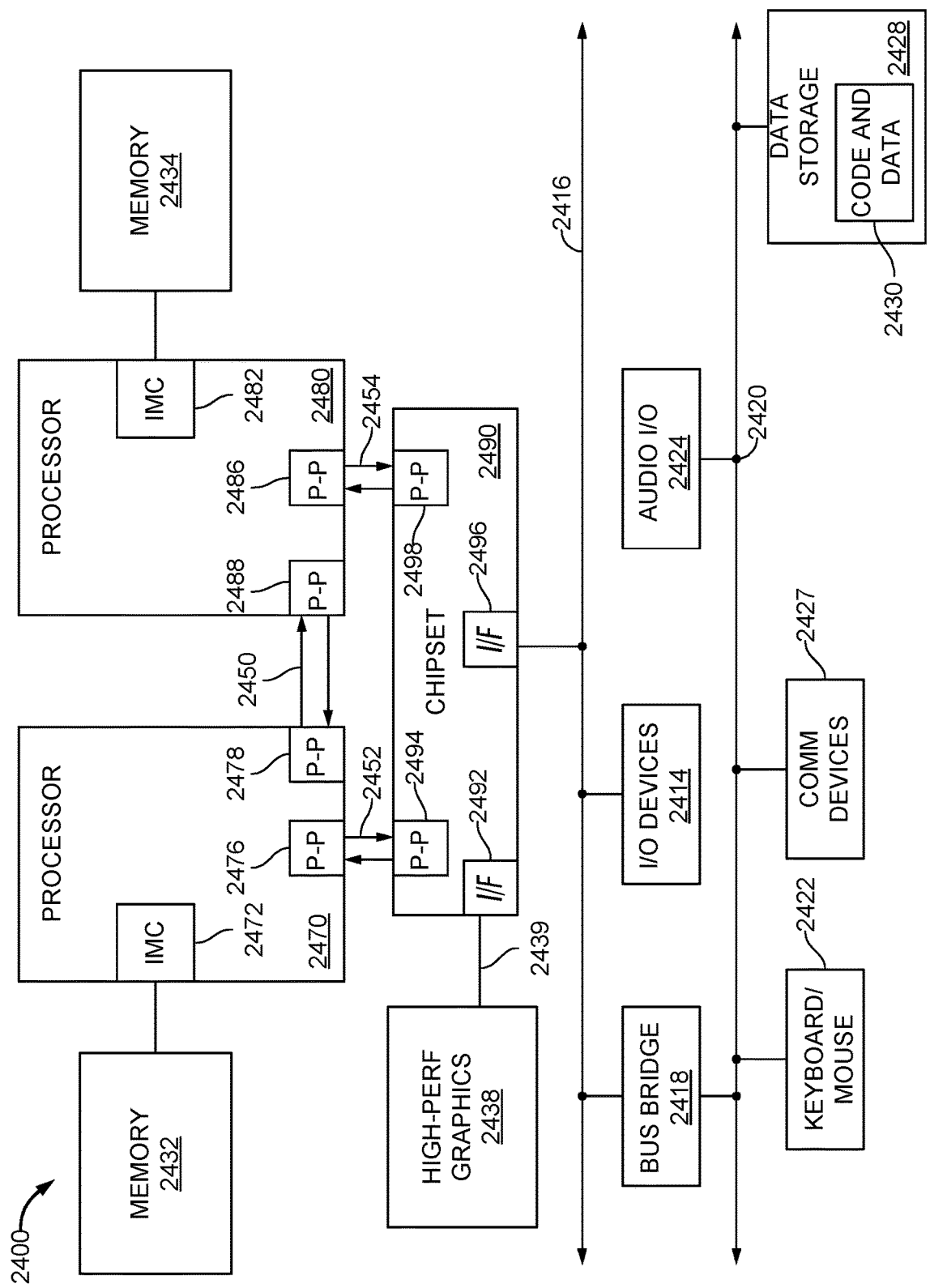
FIG. 24 illustrates an embodiment of a block for a computing system including multiple processors.

Referring now to FIG. 24, shown is a block diagram of another system 2400 in accordance with an embodiment of the present disclosure. As shown in FIG. 24, multiprocessor system 2400 is a point-to-point interconnect system, and includes a first processor 2470 and a second processor 2480 coupled via a point-to-point interconnect 2450. Each of processors 2470 and 2480 may be some version of a processor. In one embodiment, 2452 and 2454 are part of a serial, point-to-point coherent interconnect fabric, such as a high-performance architecture. As a result, aspects of the present disclosure may be implemented within the QPI architecture.

While shown with only two processors 2470, 2480, it is to be understood that the scope of the present disclosure is not so limited. In other embodiments, one or more additional processors may be present in a given processor.

Processors 2470 and 2480 are shown including integrated memory controller units 2472 and 2482, respectively. Processor 2470 also includes as part of its bus controller units point-to-point (P-P) interfaces 2476 and 2478; similarly, second processor 2480 includes P-P interfaces 2486 and 2488. Processors 2470, 2480 may exchange information via a point-to-point (P-P) interface 2450 using P-P interface circuits 2478, 2488. As shown in FIG. 24, IMCs 2472 and 2482 couple the processors to respective memories, namely a memory 2432 and a memory 2434, which may be portions of main memory locally attached to the respective processors.

Processors 2470, 2480 each exchange information with a chipset 2490 via individual P-P interfaces 2452, 2454 using point to point interface circuits 2476, 2494, 2486, 2498. Chipset 2490 also exchanges information with a high-performance graphics circuit 2438 via an interface circuit 2492 along a high-performance graphics interconnect 2439.

A shared cache (not shown) may be included in either processor or outside of both processors; yet connected with the processors via P-P interconnect, such that either or both processors' local cache information may be stored in the shared cache if a processor is placed into a low power mode.

Chipset 2490 may be coupled to a first bus 2416 via an interface 2496. In one embodiment, first bus 2416 may be a Peripheral Component Interconnect (PCI) bus, or a bus such as a PCI Express bus or another third generation I/O interconnect bus, although the scope of the present disclosure is not so limited.

As shown in FIG. 24, various I/O devices 2414 are coupled to first bus 2416, along with a bus bridge 2418 which couples first bus 2416 to a second bus 2420. In one embodiment, second bus 2420 includes a low pin count (LPC) bus. Various devices are coupled to second bus 2420 including, for example, a keyboard and/or mouse 2422, communication devices 2427 and a storage unit 2428 such as a disk drive or other mass storage device which often includes instructions/code and data 2430, in one embodiment. Further, an audio I/O 2424 is shown coupled to second bus 2420. Note that other architectures are possible, where the included components and interconnect architectures vary. For example, instead of the point-to-point architecture of FIG. 24, a system may implement a multi-drop bus or other such architecture.

It should be appreciated that, in some embodiments, a circuit board with a power tunnel may connect some or all of the various components shown in FIG. 24. Such a circuit board may include one or more power tunnels to carry current to and from any suitable component, such as the memory 2432, the processor 2470, the high-performance graphics 2438, etc.

While aspects of the present disclosure have been described with respect to a limited number of embodiments, those skilled in the art will appreciate numerous modifications and variations therefrom. It is intended that the appended claims cover all such modifications and variations as fall within the true spirit and scope of this present disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the present disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Examples

Illustrative examples of the technologies disclosed herein are provided below. An embodiment of the technologies may include any one or more, and any combination of, the examples described below.

Example 1 includes a circuit board comprising a plurality of non-conductive layers defining a plane; a plurality of conductive traces, wherein each of the plurality of conductive traces is disposed between two non-conductive layers of the plurality of non-conductive layers; and a power tunnel extending through at least one of the plurality of non-conductive layers, wherein the power tunnel comprises a conductor to connect a battery of a device to a processor of the device, wherein the power tunnel extends along the plane defined by the plurality of non-conductive layers.

Example 2 includes the subject matter of Example 1, and wherein the power tunnel extends along the plane defined by the plurality of non-conductive layers for at least five millimeters.

Example 3 includes the subject matter of any of Examples 1 and 2, and wherein the power tunnel forms at least half of a pathway connecting the battery of the device to the processor of the device.

Example 4 includes the subject matter of any of Examples 1-3, and wherein the power tunnel extends through at least three of the plurality of non-conductive layers.

Example 5 includes the subject matter of any of Examples 1-4, and wherein the power tunnel is flush with a top surface of the circuit board.

Example 6 includes the subject matter of any of Examples 1-5, and wherein the power tunnel is disposed between two non-conductive layers of the plurality of non-conductive layers.

Example 7 includes the subject matter of any of Examples 1-6, and wherein the power tunnel has a depth of at least 500 micrometers and a width of at least one millimeter.

Example 8 includes the subject matter of any of Examples 1-7, and wherein the power tunnel has a width of at least three millimeters.

Example 9 includes a system comprising the circuit board of claim 1, further comprising a battery; a processor; a memory; and a display, wherein the power tunnel connects the battery to the processor.

Example 10 includes a method of creating a circuit board, the method comprising firing a laser at a circuit board, the circuit board comprising a plurality of non-conductive layers and a plurality of conductive traces, wherein each of the plurality of conductive traces is disposed between two non-conductive layers of the plurality of non-conductive layers, wherein firing the laser comprises firing the laser to drill a hole through one or more of the non-conductive layers to reach a conductive trace of the plurality of conductive trace, wherein the laser is configured to drill through non-conductive material of the plurality of non-conductive layers and is configured not to drill through the conductive trace of the plurality of conductive layers; and filling the hole with a conductive material.

Example 11 includes the subject matter of Example 10, and wherein firing the laser comprises firing a laser above the conductive trace to remove the non-conductive layers above the conductive trace.

Example 12 includes the subject matter of any of Examples 10 and 11, and wherein firing the laser comprises firing a laser above the conductive trace to create an outline of the conductive trace in the non-conductive layers above the conductive trace that defines a chunk of the non-conductive layers.

Example 13 includes the subject matter of any of Examples 10-12, and further including removing the chunk of the non-conductive layers prior to filling the hole with the conductive material.

Example 14 includes the subject matter of any of Examples 10-13, and wherein filling the hole with the conductive material comprises filling the hole with copper using electrolytic plating.

Example 15 includes the subject matter of any of Examples 10-14, and wherein filling the hole comprises filling the hole to create a power tunnel, wherein the power tunnel extends along a plane defined by the plurality of non-conductive layers for at least five millimeters.

Example 16 includes the subject matter of any of Examples 10-15, and wherein the power tunnel is configured to connect a battery of a device to a processor of the device.

Example 17 includes the subject matter of any of Examples 10-16, and wherein the power tunnel extends through at least three of the plurality of non-conductive layers.

Example 18 includes the subject matter of any of Examples 10-17, and wherein the power tunnel is flush with a top surface of the circuit board.

Example 19 includes the subject matter of any of Examples 10-18, and wherein the power tunnel is disposed between two non-conductive layers of the plurality of non-conductive layers.

Example 20 includes the subject matter of any of Examples 10-19, and wherein the power tunnel has a depth of at least 500 micrometers and a width of at least one millimeter.

Example 21 includes the subject matter of any of Examples 10-20, and wherein the power tunnel has a width of at least three millimeters.

Example 22 includes a system comprising means for performing the method of any of Examples 10-21.

The invention claimed is:

1. A circuit board comprising:
   a plurality of non-conductive layers defining a plane;
   a plurality of conductive traces, wherein each of the plurality of conductive traces is disposed between two non-conductive layers of the plurality of non-conductive layers; and
   a power tunnel extending through at least one of the plurality of non-conductive layers,
   wherein the power tunnel comprises a conductor to connect a battery of a device to a processor of the device,
   wherein the power tunnel extends along the plane defined by the plurality of non-conductive layers.

2. The circuit board of claim 1, wherein the power tunnel extends along the plane defined by the plurality of non-conductive layers for at least five millimeters.

3. The circuit board of claim 1, wherein the power tunnel forms at least half of a pathway connecting the battery of the device to the processor of the device.

4. The circuit board of claim 1, wherein the power tunnel extends through at least three of the plurality of non-conductive layers.

5. The circuit board of claim 1, wherein the power tunnel is flush with a top surface of the circuit board.

6. The circuit board of claim 1, wherein the power tunnel is disposed between two non-conductive layers of the plurality of non-conductive layers.

7. The circuit board of claim 1, wherein the power tunnel has a depth of at least 500 micrometers and a width of at least one millimeter.

8. The circuit board of claim 7, wherein the power tunnel has a width of at least three millimeters.

9. A system comprising the circuit board of claim 1, further comprising:
   a battery;
   a processor;
   a memory; and
   a display,
   wherein the power tunnel connects the battery to the processor.

* * * * *